(12) United States Patent
Matsuura et al.

(10) Patent No.: US 11,525,073 B2
(45) Date of Patent: Dec. 13, 2022

(54) MULTILAYER CIRCUIT BOARD MANUFACTURING METHOD

(71) Applicant: MITSUI MINING & SMELTING CO., LTD., Tokyo (JP)

(72) Inventors: Yoshinori Matsuura, Ageo (JP); Tetsuro Sato, Ageo (JP); Toshimi Nakamura, Ageo (JP); Takenori Yanai, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 16/463,562

(22) PCT Filed: Nov. 24, 2017

(86) PCT No.: PCT/JP2017/042289
§ 371 (c)(1),
(2) Date: May 23, 2019

(87) PCT Pub. No.: WO2018/097265
PCT Pub. Date: May 31, 2018

(65) Prior Publication Data
US 2019/0378728 A1   Dec. 12, 2019

(30) Foreign Application Priority Data

Nov. 28, 2016   (JP) .............................. JP2016-230539
Feb. 2, 2017    (JP) .............................. JP2017-017248

(51) Int. Cl.
*C09J 7/38*   (2018.01)
*C09J 5/00*   (2006.01)
(Continued)

(52) U.S. Cl.
CPC ................ *C09J 7/385* (2018.01); *C09J 5/00* (2013.01); *C09J 7/255* (2018.01);
(Continued)

(58) Field of Classification Search
CPC ........... H01L 21/4857; H01L 23/49822; H01L 23/49838; H01L 23/12; H01L 21/6835;
(Continued)

(56) References Cited

U.S. PATENT DOCUMENTS

2004/0056344 A1*  3/2004  Ogawa .................... H01L 25/50
                                                           257/686
2005/0170612 A1   8/2005  Miyanari et al.
(Continued)

FOREIGN PATENT DOCUMENTS

CN    104219876      12/2014
JP    2002-206078    7/2002
(Continued)

OTHER PUBLICATIONS

International Search Report issued in International Patent Application No. PCT/JP2017/042289, dated Feb. 20, 2018.
(Continued)

*Primary Examiner* — Benjamin Tzu-Hung Liu
(74) *Attorney, Agent, or Firm* — Greenblum & Bernstein, P.L.C.

(57) ABSTRACT

There is a method of manufacturing a multilayer wiring board including: alternately stacking wiring layers and insulating layers; stacking a reinforcing sheet on one surface of the resulting multilayer laminate with a soluble adhesive layer therebetween, wherein an unoccupied region without the soluble adhesive layer is provided within a facing area where the reinforcing sheet faces the multilayer laminate; allowing a liquid capable of dissolving the soluble adhesive layer to infiltrate the unoccupied region to dissolve or soften the soluble adhesive layer; and releasing the reinforcing sheet from the multilayer laminate at the soluble adhesive layer. This method enables the multilayer wiring layer to be reinforced to generate no large local warpage, thereby (Continued)

improving the reliable connection and the surface flatness (coplanarity) of the multilayer wiring layer. The used reinforcing sheet can be released in a significantly short time, while minimizing the stress applied to the multilayer laminate.

12 Claims, 6 Drawing Sheets (51) Int. Cl.
*C09J 7/25* (2018.01)
*H01L 21/48* (2006.01)
*H01L 21/683* (2006.01)
*H01L 23/12* (2006.01)
*H01L 23/498* (2006.01)
*H05K 3/46* (2006.01)
*H01L 23/31* (2006.01)

(52) U.S. Cl.
CPC ...... *H01L 21/4857* (2013.01); *H01L 21/6835* (2013.01); *H01L 23/12* (2013.01); *H01L 23/49822* (2013.01); *H01L 23/49838* (2013.01); *H05K 3/46* (2013.01); *C09J 2203/326* (2013.01); *C09J 2301/502* (2020.08); *C09J 2433/00* (2013.01); *C09J 2467/006* (2013.01); *H01L 23/3121* (2013.01); *H01L 2221/68345* (2013.01); *H01L 2221/68359* (2013.01); *H01L 2221/68372* (2013.01); *H01L 2221/68381* (2013.01); *H01L 2221/68386* (2013.01)

(58) Field of Classification Search
CPC ....... H01L 23/3121; H01L 2221/68359; H01L 2221/68381; H01L 2221/68345; H01L 2221/68372; H01L 2221/68386; H01L 2224/18; H01L 2224/16225; H01L 21/6836; C09J 7/385; C09J 7/255; C09J 5/00; C09J 2301/502; C09J 2203/326; C09J 2433/00; C09J 2467/006; C09J 7/30; C09J 2301/18; C09J 2301/204; C09J 2423/046; C09J 7/22; C09J 7/20; C09J 201/06; C09J 7/243; C09J 7/28; H05K 3/46
See application file for complete search history.

(56) References Cited

U.S. PATENT DOCUMENTS

| | | | |
|---|---|---|---|
| 2007/0119541 A1* | 5/2007 | Kawabata | H05K 3/0058 156/307.7 |
| 2009/0165293 A1* | 7/2009 | Lytle | H01L 21/568 29/825 |
| 2009/0223046 A1* | 9/2009 | Murayama | H01L 21/6835 29/847 |
| 2013/0220510 A1* | 8/2013 | Yamamoto | C09J 7/38 156/60 |
| 2015/0257253 A1 | 9/2015 | Lee et al. | |
| 2018/0040500 A1* | 2/2018 | Goossens | B32B 15/01 |

FOREIGN PATENT DOCUMENTS

| | | | |
|---|---|---|---|
| JP | 02002206078 | * | 7/2002 |
| JP | 2002206078 | * | 7/2002 |
| JP | 2003-158239 | | 5/2003 |
| JP | 2005-101137 | | 4/2005 |
| JP | 2005-191550 | | 7/2005 |
| JP | 2007-150002 | | 6/2007 |
| JP | 2008-251702 | | 10/2008 |
| JP | 2011-508448 | | 3/2011 |
| JP | 2013-181054 | | 9/2013 |
| JP | 2015-35551 | | 2/2015 |
| JP | 2015-076477 | | 4/2015 |
| JP | 2015-170767 | | 9/2015 |
| JP | 2016-167487 | | 9/2016 |
| JP | 2016167487 | * | 9/2016 |
| WO | 2014/054811 | | 4/2014 |
| WO | 2016/067422 | | 5/2016 |

OTHER PUBLICATIONS

Written Opinion of the International Searching Authority for PCT/JP2017/042289, dated Feb. 20, 2018.

* cited by examiner

MULTILAYER CIRCUIT BOARD MANUFACTURING METHOD

TECHNICAL FIELD

The present invention relates to a method of manufacturing a multilayer wiring board.

BACKGROUND ART

In recent years, multilayering of printed wiring boards has been widely prevailed to increase the mounting density of printed wiring boards and miniaturize the boards. Such multilayer printed wiring boards have been extensively used in portable electronic devices for the purpose of weight reduction and miniaturization. These multilayer printed wiring boards require a further reduction in thickness of interlayer insulating layers and a further reduction in weight of wiring boards.

A technique that satisfies such requirements employs a method of manufacturing a multilayer printed wiring board by a coreless build-up process. In the coreless build-up process, insulating layers and wiring layers are alternately stacked (built up) on a core material by a procedure called a build-up process into a multilayer structure, and then the core material is removed to leave a wiring board consisting only of the build-up layer. In the coreless build-up process, the use of a copper foil with a carrier has been proposed to facilitate the separation of the multilayer printed wiring board from a support. For example, PTL 1 (JP2005-101137A) discloses a method of manufacturing a packaging substrate for mounting semiconductor devices, the method comprising: bonding an insulating resin layer to a carrier surface of a copper foil with a carrier to form a support; forming a first wiring conductor through a photoresist process on the extremely thin copper layer of the copper foil with a carrier, a patterned electroplating process of copper, and a stripping process of the photoresist; forming a build-up wiring layer; separating a support substrate with a carrier; and removing the extremely thin copper layer.

In particular, further miniaturization and power saving of electronic devices increasingly require high integration and thinning of semiconductor chips and printed wiring boards. Recently, the introduction of fan-out wafer level packaging (FO-WLP) and panel level packaging (PLP) have been studied as next generation packaging technologies that satisfy such a demand. The use of a coreless build-up process is also being studied in the FO-WLP and the PLP. One of such methods includes a process called an RDL-first (redistribution layer-first) process, in which a wiring layer and an optional build-up wiring layer are formed on the surface of a coreless support, the support is separated as required, and then the chips are mounted.

For example, PTL 2 (JP2015-35551A) discloses a method of manufacturing a semiconductor device. The method comprises forming a metal release layer on a main surface of a support made of a glass or silicon wafer; forming an insulating resin layer on the metal release layer; forming a redistribution layer including a build-up layer on the insulating resin layer; mounting and sealing a semiconductor integrated circuit on the redistribution layer; exposing the release layer by removal of the support; exposing a secondary mounting pad by removal of the release layer; forming solder bumps on the surface of the secondary mounting pad; and performing secondary mounting. PTL 3 (JP2008-251702A) discloses a method of manufacturing a semiconductor device. The method comprises forming an embedded wiring layer as a first electrode pad on a coreless support; forming another embedded wiring layer as a second electrode pad on the embedded wiring layer; removing the coreless support; and then mounting a chip from the back side of the embedded wiring layer. PTL 4 (JP2015-170767A) discloses a method of manufacturing a circuit board. The method comprises forming a release layer on a coreless support; forming an embedded wiring layer and a build-up layer on the release layer; mounting a wiring board on the surface of the build-up layer; removing a carrier; and mounting a semiconductor chip. This release layer comprises a composition that generates gas caused by irradiation with ultraviolet rays and facilitates separation of the support and removal of the release layer without damaging the wiring layer.

Meanwhile, PTL 5 (JP2015-76477A) discloses a method of manufacturing an electronic device. The method comprises forming a first release layer on a support; forming a second release layer that covers the first release layer; forming a resin layer including wirings on the second release layer; connecting the resin layer to a substrate; releasing the support by removal of the first release layer and the second release layer; and connecting an electronic component on the resin layer. This patent literature also discloses that the first release layer is composed of an inorganic insulating material having alkali-solubility, and the second release layer is composed of an inorganic material having alkali-insolubility.

CITATION LIST

Patent Literatures

PTL 1: JP2005-101137A
PTL 2: JP2015-35551A
PTL 3: JP2008-251702A
PTL 4: JP2015-170767A
PTL 5: JP2015-76477A

SUMMARY OF INVENTION

Thinning of a build-up layer is required in view of recent technical trends to employ FO-WLP and PLP as described above. However, in the case of a thin build-up layer, a large local warpage of the build-up layer may occur when a substrate is removed from the substrate provided with the build-up layer produced by a coreless build-up process. Such a large warpage of the build-up layer may cause disconnection and separation of the wiring layer inside the build-up layer, and thereby decrease the reliability of connection in the wiring layer. In order to address such a problem, a reinforcing sheet may be stacked on a multilayer laminate with an adhesive release layer therebetween. As a result, the multilayer wiring layer can be reinforced to an extent not causing a large local warpage, resulting in an improvement in reliable connection in the multilayer wiring layer and the flatness (coplanarity) on the surface of the multilayer wiring layer. The remaining issue is how to efficiently release the reinforcing sheet closely bonded to the multilayer laminate with the adhesive release layer therebetween without applying of an excessive stress to the multilayer laminate.

The present inventors have now found that, in the manufacturing of a multilayer wiring board, the multilayer wiring layer can be reinforced not to cause a large local warpage by stacking a reinforcing sheet on the multilayer laminate, resulting in an improvement in the reliable connection in the multilayer wiring layer and the flatness (coplanarity) on the surface of the multilayer wiring layer. Furthermore, the present inventors have also found that the reinforcing sheet having finished its role can be released in a significantly short time while minimizing the stress applied to the multilayer laminate through a dissolution release procedure or a similar procedure, in which a soluble adhesive layer is applied for stacking the reinforcing sheet on the multilayer laminate and an unoccupied region without the soluble adhesive layer is provided within a predetermined region.

Accordingly, a first object of the present invention is to provide a method of manufacturing a multilayer wiring board, in which the multilayer wiring layer can be reinforced to an extent not causing a large local warpage, resulting in an improvement in the reliable connection in the multilayer wiring layer and the flatness (coplanarity) on the surface of the multilayer wiring layer. A second object of the present invention is to provide a method of manufacturing a multilayer wiring board, in which a reinforcing sheet having finished its role can be released in a significantly short time while minimizing the stress applied to the multilayer laminate.

According to one embodiment of the present invention, a method of manufacturing a multilayer wiring board is provided, the method comprising the steps of:
  alternately stacking wiring layers and insulating layers to produce a multilayer laminate;
  stacking a reinforcing sheet on one surface of the multilayer laminate with a soluble adhesive layer therebetween, wherein an unoccupied region without the soluble adhesive layer is provided within a facing area where the reinforcing sheet faces the multilayer laminate;
  allowing a liquid capable of dissolving the soluble adhesive layer to infiltrate the unoccupied region to dissolve or soften the soluble adhesive layer; and
  releasing the reinforcing sheet from the multilayer laminate at the soluble adhesive layer to give a multilayer wiring board.

DESCRIPTION OF EMBODIMENTS

Method of Manufacturing Multilayer Wiring Board

A method of manufacturing a multilayer wiring board according to the present invention comprises the steps of (1) providing an optional laminated sheet, (2) forming a multilayer laminate, (3) stacking a reinforcing sheet, (4) optionally releasing a substrate, (5) optionally removing a metal layer by etching, (6) optionally treating the surface of a first wiring layer, (7) optionally mounting an electronic device, (8) dissolving or softening a soluble adhesive layer, and (9) releasing the reinforcing sheet.

Steps (1) to (9) will now be described with reference to the accompanying drawings.

(1) Provision of Laminated Sheet (Optional Step)

Figure 1:
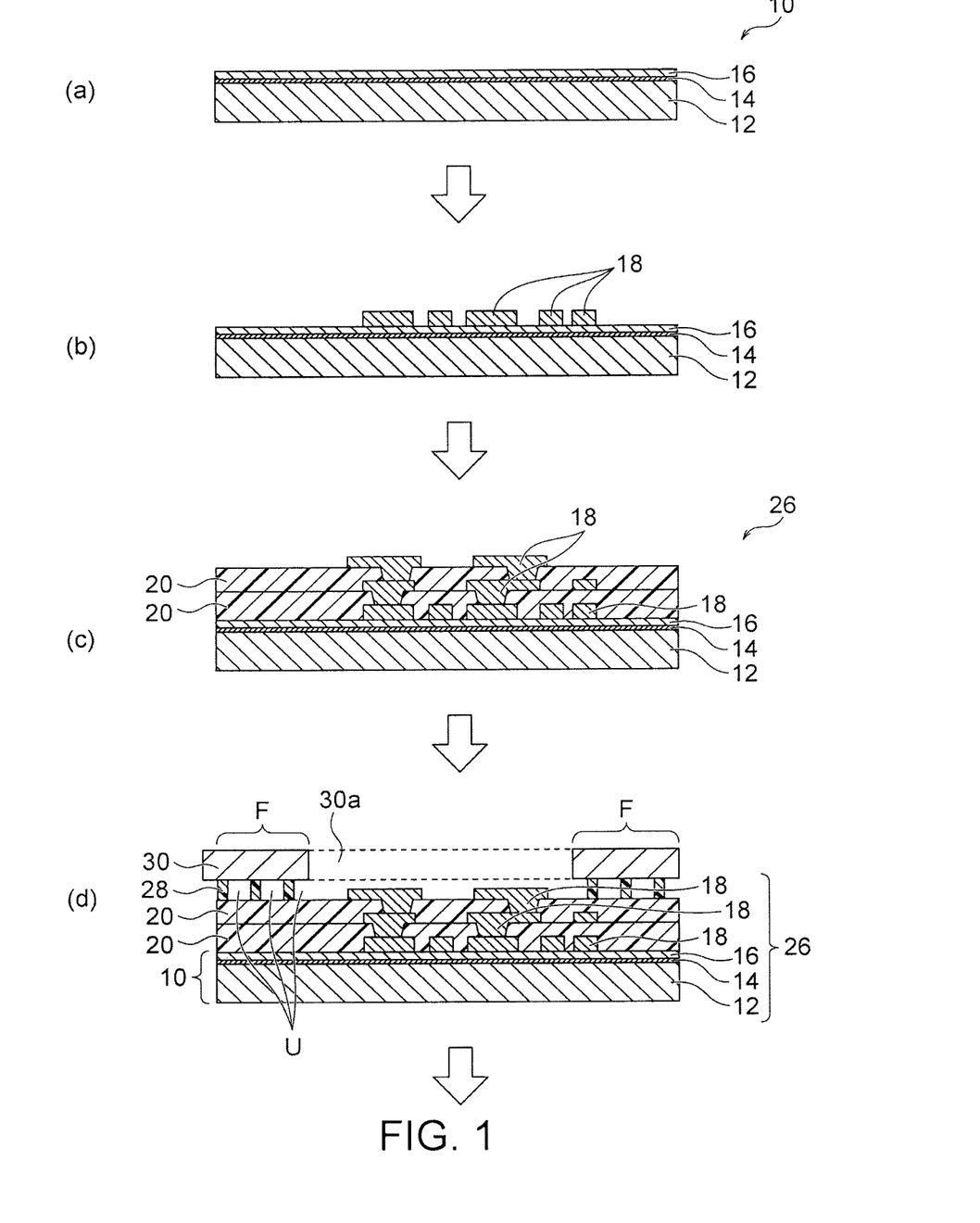
FIG. 1 is a flow chart illustrating the steps from provision of a laminated sheet to stacking of a reinforcing sheet in a method of the present invention.

With reference to FIG. 1(a), a laminated sheet 10 is optionally provided as a base to form a multilayer wiring board. The laminated sheet 10 comprises, in sequence, a substrate 12, a release layer 14, and a metal layer 16. The laminated sheet 10 may be in the form of a so-called copper foil with a carrier. Preferred embodiment of the laminated sheet 10 in the present invention will be described later.

(2) Production of Multilayer Laminate

As shown in FIGS. 1(b) and 1(c), wiring layers 18 and insulating layers 20 are alternately stacked to produce a multilayer laminate 26. The sequential stacked structure composed of the wiring layers 18 and the insulating layers 20 shown in FIGS. 1(b) and 1(c) is generally referred to as a build-up layer or a build-up wiring layer. Examples of the method in the present invention include, but is not limited to, forming a multilayer laminate consisting of only a known build-up wiring layer structure commonly employed in a printed wiring board and stacking a laminate which builds up a part of a multilayer laminate with preliminarily formed bumps, with an insulating adhesive layer therebetween.

A base for forming a multilayer wiring board is composed of any material. When the laminated sheet 10 as described above is used as the base, the multilayer laminate 26 is preferably formed on the surface of the metal layer 16 in the laminated sheet 10. Preferred method of manufacturing the multilayer laminate 26 will be described below when the laminated sheet 10 is used as the base.

In this case, with reference to FIG. 1(b), a first wiring layer 18 is formed on a surface of the metal layer 16. Typically, the first wiring layer 18 is formed in accordance with a known procedure through formation of a photoresist layer, formation of an electroplated copper layer, stripping of the photoresist layer, and optional copper flash etching. For example, the photoresist layer is initially formed into a predetermined pattern on the surface of the metal layer 16. The photoresist is preferably a photosensitive film, such as a photosensitive dry film. The photoresist layer may be provided with a predetermined wiring pattern through exposure and development. The electroplated copper layer is formed on the exposed surface of the metal layer 16 (that is, a portion not masked with the photoresist layer). Copper may be electroplated by any known procedure. The photoresist layer is then stripped. As a result, the electroplated copper layer remains in the form of the first wiring layer 18 that has the wiring pattern, and the metal layer 16 is exposed at a portion or portions where the wiring pattern is not formed.

In the case that the metal layer 16 includes not only a power supply sublayer but also an antireflection sublayer, a portion corresponding to the power supply sublayer of the metal layer 16 may be removed by flash etching to expose the antireflection sublayer. This facilitates an image inspection described later. The antireflection sublayer is preferably composed of at least one metal selected from Cr, W, Ta, Ti, Ni and Mo. These metals do not dissolve in a copper flash etching solution, and thereby can exhibit excellent chemical resistance to the copper flash etching solution.

As shown in FIG. 1(c), the insulating layers 20 and the n-th wiring layers 18 (n is an integer of 2 or more) are alternately stacked on a surface provided with the first wiring layer 18 of the laminated sheet 10 to give a multilayer laminate 26 in which the first wiring layer 18 is incorporated in the form of an embedded wiring layer. That is, two or more wiring layers 18 are provided, and can be referred to as a first wiring layer, a second wiring layer, . . . , an n-th wiring layer. One or more insulating layers 20 may be provided. That is, the multilayer wiring board 40 in the present invention includes at least two wiring layers 18 (that is, at least the first wiring layer 18 and the second wiring layer 18) along with at least one insulating layer 20.

A solder resist layer and/or a surface metal treatment layer (for example, an organic solderability preservative (OSP) treatment layer, a plated Au layer, and a plated Ni—Au layer) may be optionally formed on the wiring layer at the outermost surface of the build-up wiring layer.

(3) Stacking of Reinforcing Sheet

As shown in FIG. 1(d), a reinforcing sheet 30 is stacked to one surface of the multilayer laminate 26 (for example, the surface, remote from the laminated sheet 10, of the multilayer laminate 26) with the soluble adhesive layer 28 therebetween. In this step, the multilayer laminate 26 can be reinforced so as not to cause large local warpage by the reinforcing sheet 30. Accordingly, the warpage during releasing is effectively prevented or reduced. The disconnection and separation of the wiring layer which may be caused by the warpage can be avoided inside the build-up wiring layer, thereby the reliability of connection in the multilayer wiring layer can be improved. In addition, the flatness (coplanarity) on the surface of the multilayer wiring layer can be improved through the effective prevention or reduction of the warpage.

In stacking of the reinforcing sheet 30, an unoccupied region U without the soluble adhesive layer 28 is provided within a facing area F where the reinforcing sheet 30 faces the multilayer laminate 26. The unoccupied region U allows a dissolving liquid to contact or infiltrate the soluble adhesive layer 28 in a later step, and thus facilitate the release of the reinforcing sheet 30 through a dissolution release procedure or a similar procedure. In other words, the unoccupied region U can provide a gap between the reinforcing sheet 30 and the multilayer laminate 26, and the dissolving liquid can infiltrate the facing area F through the gap.

Figure 4:
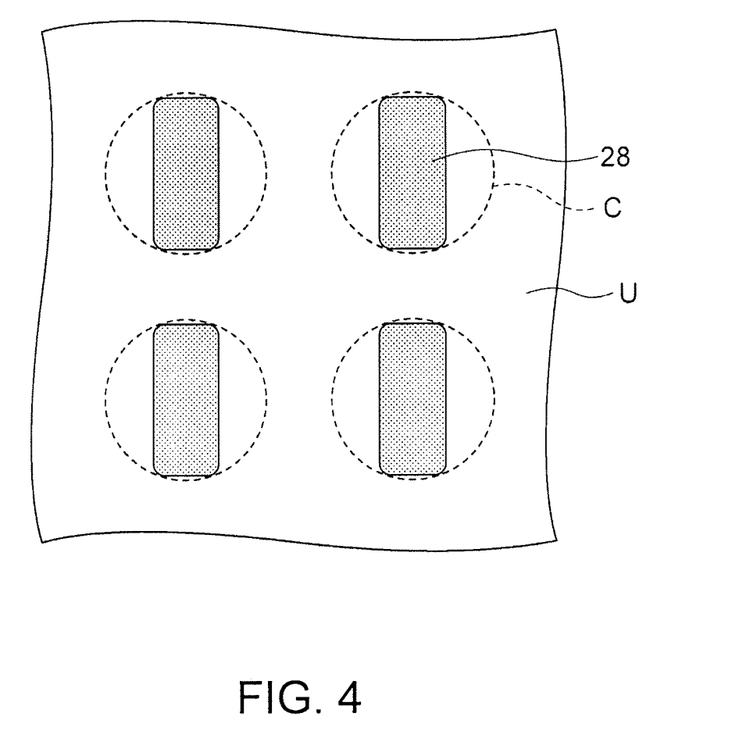
FIG. 4 is a view schematically illustrating an occupied region covered with a soluble adhesive layer and an unoccupied region not covered with a soluble adhesive layer.
Figure 5:
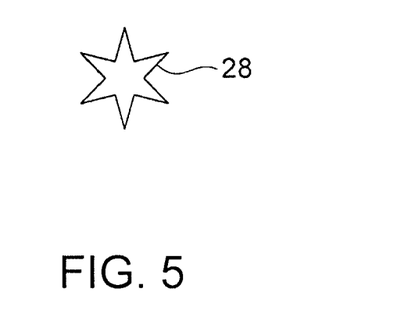
FIG. 5 is a view illustrating another example shape of the occupied region covered with a soluble adhesive layer.
Figure 6:
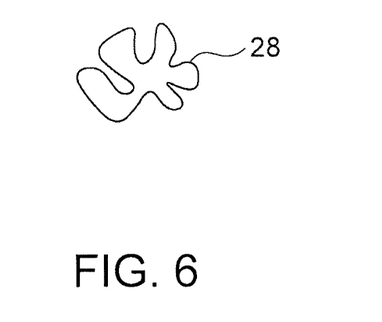
FIG. 6 is a view illustrating a further example shape of the occupied region covered with the soluble adhesive layer.

The soluble adhesive layer 28 may have any shape and size that defines the unoccupied region U through appropriately determining depending on the purpose. In particular, as shown in FIG. 4, the soluble adhesive layer 28 is preferably partitioned into multiple occupied regions. In other words, the unoccupied region U preferably surrounds each of the occupied regions. In this situation, a circumscribed circle diameter C (see FIG. 4) in each occupied region covered with the soluble adhesive layer 28 is preferably 0.1 to 10 mm, more preferably 0.2 to 8.0 mm, further more preferably 0.5 to 5.0 mm. Such ranges of the diameter can promote the infiltration of the dissolving liquid into the facing area F while sufficiently maintaining an adhesive force of the soluble adhesive layer 28 before the infiltration of the dissolving liquid, and thereby further facilitate the release of the reinforcing sheet 30 through, for example, the dissolution release procedure. Examples of the shape of each occupied region surrounded by the unoccupied region U (partitioned soluble adhesive layer 28) include: various shapes of, for example, various polygons such as rectangles shown in FIG. 4 and circles; polygons in which straight line contours are intricate such as the star-shaped polygon shown in FIG. 5; and deformed shapes having the contour with intricate curves as shown in FIG. 6. The partitioned shapes of the soluble adhesive layer 28 may be formed by a known method, such as dotted pattern printing or screen printing.

The ratio of the area of the unoccupied region U to that of the facing area F is preferably 20 to 90 area %, more preferably 40 to 85 area %, further more preferably 50 to 75 area %. Such a range can promote the infiltration of the dissolving liquid into the facing area F while sufficiently maintaining the adhesive force of the soluble adhesive layer 28 before the infiltration of the dissolving liquid, and thereby further facilitate the release of the reinforcing sheet 30 through, for example, the dissolution release procedure. The area of the facing area F is the sum of the area of the occupied region of the soluble adhesive layer 28 and the area of the unoccupied region U. In other words, the ratio of the area of the occupied region of the soluble adhesive layer 28 to that of the facing area F is preferably 10 to 80 area %, more preferably 15 to 60 area %, further more preferably 25 to 50 area %.

The soluble adhesive layer 28 can be used to bond the reinforcing sheet 30 to the multilayer laminate 26 in a desired adhesion level, and may be any layer that can be dissolved or softened through the contact with a dissolving liquid used in a later step, except for the configuration to form the unoccupied region U. The soluble adhesive layer 28 may be a known layer referred to, for example, as an adhesive layer, an adhesive release layer, or a release layer. The soluble adhesive layer 28 typically has adhesiveness, thus may be typically an adhesive layer or an adhesive release layer. Alternatively, the soluble adhesive layer 28 may be a release layer having no adhesiveness. In addition, an applied area of the soluble adhesive layer 28 can be appropriately adjusted while holding the advantageous effect of this invention.

The soluble adhesive layer 28 includes preferably a solution-soluble resin, more preferably an acid-soluble resin or an alkali-soluble resin. The solution-soluble resin (for example, the acid-soluble resin or the alkali-soluble resin) can be effectively dissolved or softened or in a dissolving liquid (for example, an acid solution or an alkaline solution), resulting in more effective release of the reinforcing sheet 30 in the later process. In addition, the release strength of the reinforcing sheet 30 can be controlled depending on the content of chemical-soluble components and the thickness of the resin layer. Exemplary acid-soluble resins include resin compositions filled with an acid-soluble filler, such as silica, calcium carbonate, and barium sulfate, at a high concentration of 60 wt % or more. Examples of the resins constituting the resin compositions include epoxy resins, acrylic resins, methacrylic resins, melamine resins, polyester resins, styrene butadiene copolymers, acrylonitrile resins, and polyimide resins. Exemplary alkali-soluble resins include methacrylic acid polymers and acrylic acid polymers. Example of the methacrylic acid polymers includes alkyl methacrylate having alkyl groups with 1 to 18 carbon atoms. Example of the acrylic acid polymers includes alkyl acrylate having alkyl groups with 1 to 18 carbon atoms. In this case, the resin composition may contain, for example, styrene monomers and styrene oligomers in order to improve the strength of the resin. The resin composition may also contain epoxy resins that can be thermally hardened with these resins. Furthermore, the resin compositions may contain, for example, an amine curing agent, a phenol curing agent, and an isocyanate group-containing curing agent in order to improve the thermosetting property with the epoxy resins.

The soluble adhesive layer 28 has a thickness in the range of preferably 0.5 to 50 μm, more preferably 0.8 to 45 μm, particularly more preferably 1.0 to 40 μm. Such a range can promote the infiltration of the dissolving liquid into the facing area F (that is, promote the dissolution or softening of the soluble adhesive layer 28) while sufficiently maintaining the adhesive force of the soluble adhesive layer 28 before the infiltration of the dissolving liquid, and thereby further facilitate the release of the reinforcing sheet 30.

In the embodiment using the laminated sheet 10, the soluble adhesive layer 28 preferably exhibits a release strength higher than that of the release layer 14. A method of comparing the release strength of the soluble adhesive layer 28 with that of the release layer 14 may be based on the comparison between absolute values of the respective release strengths as described later, or advantageously based on the comparison between the measured values in accordance with the respective releasing patterns in the process of manufacturing the multilayer wiring board. Specifically, the release strength of the release layer 14 may be a first proof stress generated when the substrate 12 is released from the build-up wiring layer while the release strength of the soluble adhesive layer 28 may be a second proof stress generated when the reinforcing sheet 30 is released from the multilayer laminate 26, and these proof stresses can be compared.

The release strength of the soluble adhesive layer 28 has preferably 1.02 to 300 times, more preferably 1.05 to 100 times, further more preferably 3.0 to 50 times, and particularly more preferably 5.0 to 30 times the release strength of the release layer 14. For example, the soluble adhesive layer 28 has a release strength of preferably 30 to 300 gf/cm, more preferably 40 to 250 gf/cm, further more preferably 50 to 175 gf/cm, particularly more preferably 70 to 150 gf/cm. Within such ranges, a stress concentration on the multilayer wiring layer can be more effectively prevented when the substrate 12 is released at the release layer 14, and thereby the disconnection in the multilayer wiring layer can be avoided more effectively. In addition, the unusual release (accompanying release) of the soluble adhesive layer 28 can be prevented more effectively when the substrate 12 is released at the release layer 14; hence, the surface of the first wiring layer 18 can be kept flat more definitely after the substrate 12 is released at the release layer 14. The release strength of the soluble adhesive layer 28 can be measured basically in the same manner as the above method of measuring the release strength of the release layer 14, but it should be noted that this strength refers to the release strength measured before the contact with the dissolving liquid. Specifically, the release strength of the soluble adhesive layer 28 is measured as follows. The soluble adhesive layer 28 is formed on the reinforcing sheet 30, and a copper foil having a thickness of 18 μm is stacked on the soluble adhesive layer 28 to form a copper-clad laminate. A release strength (gf/cm) is then measured in accordance with JIS C 6481-1996 at the time when the copper foil is released.

Figure 7:
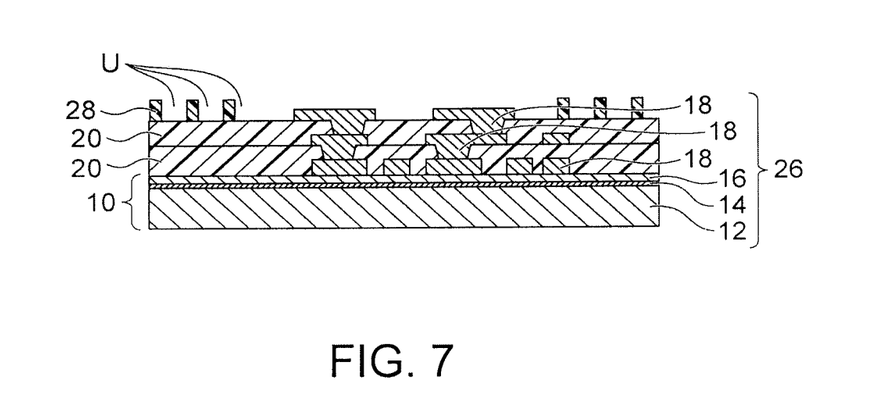
FIG. 7 is a view illustrating an example method for forming a soluble adhesive layer.
Figure 8:
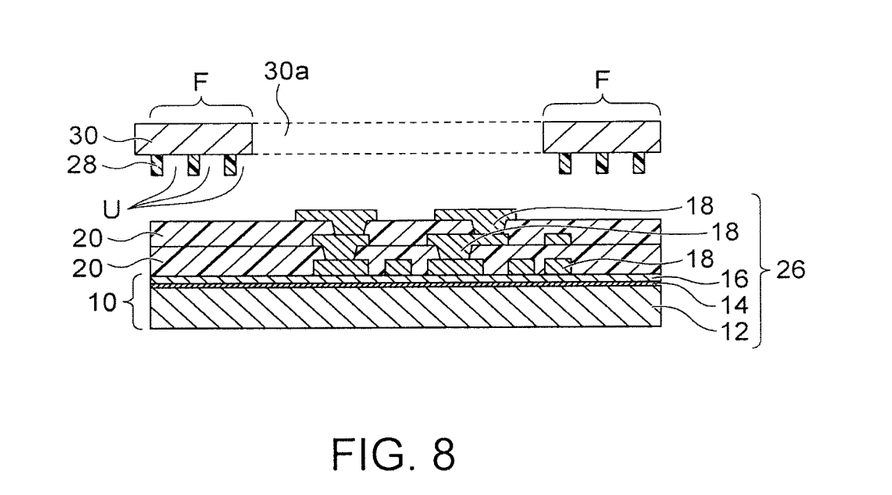
FIG. 8 is a view illustrating another example method for forming a soluble adhesive layer.

The soluble adhesive layer 28 may be formed by any procedure. For example, as shown in FIG. 7, the reinforcing sheet 30 may be stacked after the soluble adhesive layer 28 is formed on the multilayer laminate 26. As shown in FIG. 8, it is preferred that a composite sheet composed of the reinforcing sheet 30 provided with the soluble adhesive layer 28 be preliminarily formed and the soluble adhesive layer 28 be then stacked on the multilayer laminate 26 by transferring from the composite sheet, from the viewpoint of a controlled thickness of the soluble adhesive layer 28 and a simplified alignment process.

Figure 9:
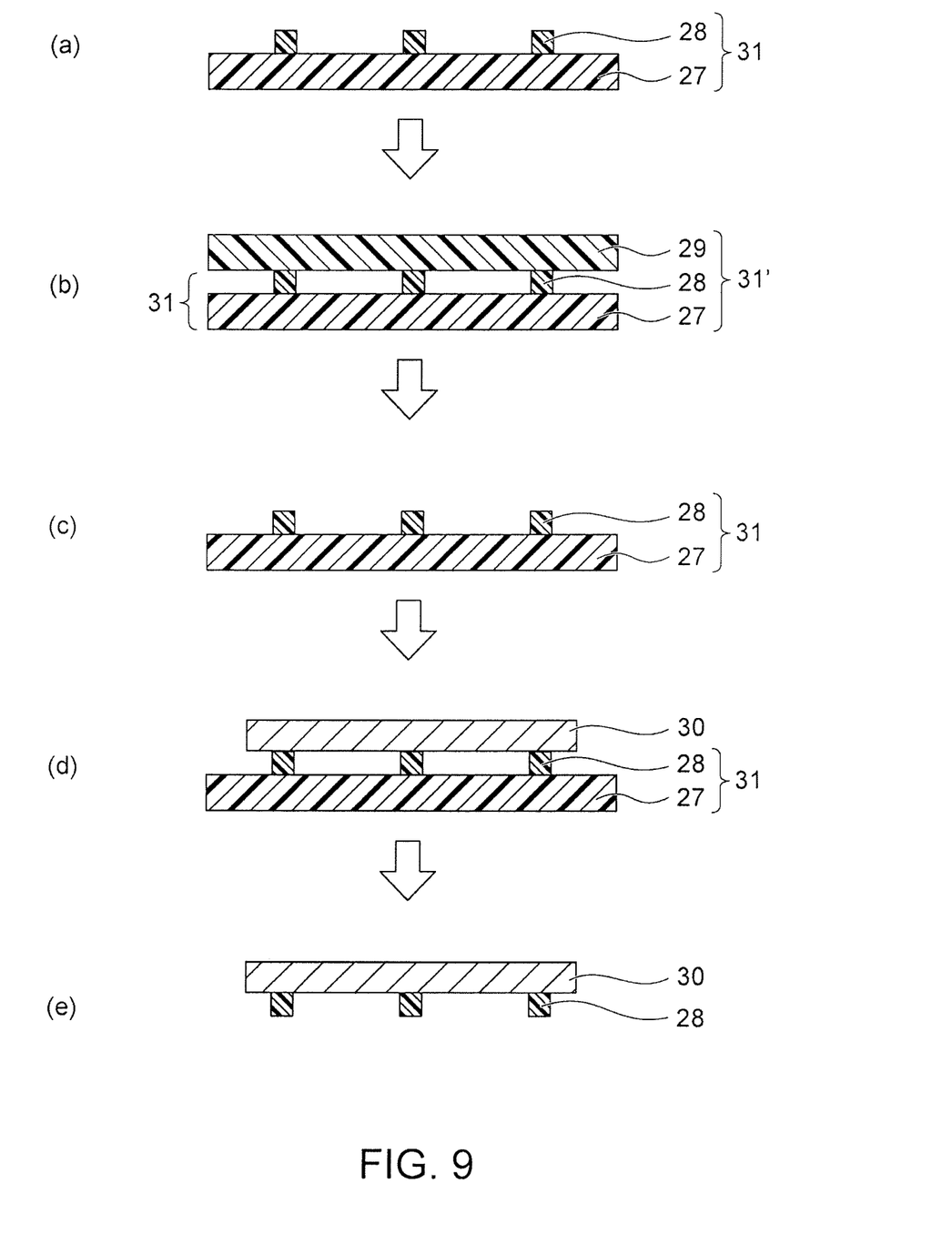
FIG. 9 is a flow chart illustrating an exemplary step for forming a reinforcing sheet provided with a soluble adhesive layer.

As shown in FIG. 9, a process of stacking the reinforcing sheet 30 interposing the soluble adhesive layer 28 preferably comprises the steps of: (i) providing a composite film 31 comprising the soluble adhesive layer 28 on a first protective film 27 (see FIG. 9(a)); (ii) stacking the composite film 31 on the reinforcing sheet 30 and/or the multilayer laminate 26 such that the soluble adhesive layer 28 comes into contact with the reinforcing sheet 30 and/or the multilayer laminate 26 (see FIG. 9(d)); and (iii) releasing the first protective film 27 from the soluble adhesive layer 28 (see FIG. 9(e)). As described above, use of the first protective film 27 as a support facilitates formation of a desired pattern, such as a dotted pattern through a printing process. Preferred examples of the material constituting the first protective film 27 include polyethylene, polypropylene, poly(ethylene terephthalate), poly(ethylene naphthalate), polyimide, syndiotactic polystyrene, aromatic polyamide, modified polyphenylene ether, fluorinated polymer, and liquid crystal polymer. In addition, a release agent may be applied onto a surface of the first protective film 27, the surface being adjacent to the soluble adhesive layer 28.

As shown in FIG. 9(b), preferably the step (i) of providing the composite film 31 further comprises the step of providing a second protective film 29 on a surface of the composite film 31, the surface being adjacent to the soluble adhesive layer 28. The resultant composite film 31' has the soluble adhesive layer 28 interposed between the first protective film 27 and the second protective film 29. In this configuration, the second protective film 29 may be released before the composite film 31 is stacked onto the reinforcing sheet 30 and/or the multilayer laminate 26 (see FIG. 9(c)). The second protective film 29 can be used as a protective layer for the soluble adhesive layer 28, resulting in preventing the deformation and the involvement of foreign matter due to the tackiness of the soluble adhesive layer 28. Preferred examples of the material constituting the second protective film 29 include polyethylene, polypropylene, poly(ethylene terephthalate), poly(ethylene naphthalate), a polyimide, syndiotactic polystyrene, aromatic polyamide, modified polyphenylene ether, fluorinated polymer, and liquid crystal polymer. In addition, a release agent may be applied onto a surface of the second protective film 29, the surface being adjacent to the soluble adhesive layer 28.

In the case that both the first protective film 27 and the second protective film 29 are used, the adhesive force (for example, release strength) between the soluble adhesive layer 28 and the first protective film 27 is preferably higher than the adhesive force (release strength) between the soluble adhesive layer 28 and the second protective film 29. Such a difference causes preferential release of the second protective film 29 to the first protective film 27; hence, the second protective film 29 can be released more readily and smoothly while the adhesion between the first protective film 27 and the soluble adhesive layer 28 is stably maintained. Alternatively, an adhesive force (for example, release strength) between the soluble adhesive layer 28 and the reinforcing sheet 30 is preferably higher than an adhesive force (release strength) between the soluble adhesive layer 28 and the first protective film 27. This difference causes preferential release of the first protective film 27 to the reinforcing sheet 30; hence, the first protective film 27 can be released more readily and smoothly while the adhesion between the soluble adhesive layer 28 and the reinforcing sheet 30 is stably maintained.

In the embodiment using the laminated sheet 10, the reinforcing sheet 30 preferably has a Vickers hardness lower than that of the substrate 12. When the reinforcing sheet 30 is stacked or released, the reinforcing sheet 30 itself warps, thereby the stress caused by stacking or releasing can be appropriately relieved. As a result, the warpage of the multilayer laminate 26 including the substrate 12 can be effectively prevented or reduced. The Vickers hardness of the reinforcing sheet 30 is preferably 2 to 99%, more preferably 6 to 90%, further more preferably 10 to 85% of the Vickers hardness of the substrate 12. Preferably, the reinforcing sheet 30 exhibits a Vickers hardness of 50 to 700 HV and the substrate 12 exhibits a Vickers hardness of 500 to 3000 HV, more preferably the reinforcing sheet 30 exhibits a Vickers hardness of 150 to 550 HV and the substrate 12 exhibits a Vickers hardness of 550 to 2500 HV, and further more preferably the reinforcing sheet 30 exhibits a Vickers hardness of 200 to 500 HV and the substrate 12 exhibits a Vickers hardness of 600 to 2000 HV. In the present specification, the Vickers hardness is measured in accordance with the "Vickers hardness test" described in JIS Z 2244-2009.

For reference, the Vickers hardness HV of various candidate materials is exemplified as follows: sapphire glass (2300 HV), hard metal alloy (1700 HV), cermet (1650 HV), quartz (rock crystal) (1103 HV), SKH 56 (high speed tool steel, HSS) (722 HV), tempered glass (640 HV), SUS 440 C (stainless steel) (615 HV), SUS 630 (stainless steel) (375 HV), titanium alloy 60-types (64 titanium alloy) (about 280 HV), Inconel (heat resistant nickel alloy) (150 to 280 HV), S 45 C (carbon steel for machine structural use) (201 to 269 HV), Hastelloy alloy (corrosion resistant nickel alloy) (100 to 230 HV), SUS 304 (stainless steel) (187 HV), SUS 430 (stainless steel) (183 HV), cast iron (160 to 180 HV), titanium alloy (110 to 150 HV), brass (80 to 150 HV), and bronze (50 to 100 HV).

The reinforcing sheet 30 has a spring deflection limit $Kb_{0.1}$ of preferably 100 to 1500 N/mm$^2$, more preferably 150 to 1200 N/mm$^2$, further more preferably 200 to 1000 N/mm$^2$ as measured in accordance with the repeated deflection test of JIS H 3130-2012. Within such ranges, the reinforcing sheet 30 itself is warped when the reinforcing sheet 30 is stacked or released, such that the stress that may be generated during stacking or releasing can be appropriately relieved and thereby the warpage of the multilayer laminate 26 can be effectively prevented or reduced. Since the reinforcing sheet 30 warped when stacked or released can instantaneously return back to the original flat shape due to its resiliency, the flatness of the multilayer laminate 26 can be more effectively maintained. In addition, the use of the flexibility and resiliency of the reinforcing sheet 30 can urge the reinforcing sheet 30 to which the releasing force is applied in the direction of the release (that is, in the direction away from the multilayer laminate 26), resulting in further smooth release.

For reference, spring deflection limit Kb for various candidate materials are illustrated in Tables 1 and 2.

TABLE 1

| Material (JIS Number) | Tempering | $Kb_{0.1}$ |
|---|---|---|
| SUS301CSP (stainless steel) | 1/2H | 315 |
| | 3/4H | 390 |
| | H | 490 |
| | EH | 590 |
| | SHE(1) | 650 |
| SUS304CSP (stainless steel) | 1/2H | 275 |
| | 3/4H | 335 |
| | H | 390 |
| SUS631CSP (stainless steel) | O | 635 |
| | 1/2H | 635 |
| | 3/4H | 835 |
| | H | 980 |
| SUS632J1CSP (stainless steel) | 1/2H | 1200 |
| | 3/4H | 1400 |
| C1700 (beryllium-copper alloy) | O | 685 |
| | 1/4H | 785 |
| | 1/2H | 835 |
| | H | 855 |
| C1720 (beryllium-copper alloy) | O | 735 |
| | 1/4H | 835 |
| | 1/2H | 885 |
| | H | 930 |
| C1720M (beryllium-copper alloy) *mill-hardened material | OM | 390 |
| | 1/4HM | 440 |
| | 1/2HM | 540 |
| | HM | 635 |

TABLE 2

| Material (JIS Number) | Tempering | $Kb_{0.1}$ |
|---|---|---|
| C5210 (phosphor bronze) | 1/2H | 245 |
| | H | 390 |
| | EH | 460 |
| | SH | 510 |
| | ESH | 560 |
| C5240 (phosphor bronze) | H | 430 |
| | EH | 510 |
| | SH | 570 |
| | ESH | 630 |
| | XSH | 700 |
| C7270 (nickel-tin-copper alloy) | O | 490 |
| | 1/4H | 590 |
| | 1/2H | 635 |
| | H | 685 |
| | EH | 735 |
| | SH | 785 |
| C7270M (nickel-tin-copper alloy) *mill-hardened material | OM | 440 |
| | 1/4HM | 490 |
| | 1/2HM | 540 |
| | HM | 590 |
| | EHM | 685 |
| | XHM | 785 |
| C7701 (nickel-zinc-copper alloy) | 1/2H | 390 |
| | H | 480 |
| | EH | 560 |
| | SH | 620 |
| C1990M (titanium-copper alloy) *mill-hardened material | 1/4HM | 440 |
| | EHM | 590 |

The reinforcing sheet 30 may be composed of any material, preferably resin, metal, glass or a combination thereof. Examples of the resin include epoxy resins, polyimide resins, polyethylene resins, phenol resins, and prepregs composed of such resins and fiber reinforcing materials. Examples of the metal include stainless steel, and copper alloy (for example, bronze, phosphor bronze, copper-nickel alloy, copper-titanium alloy) from the viewpoint of the Vickers hardness and the spring deflection limit $Kb_{0.1}$, preferably stainless steel from the viewpoint of the chemical resistance. The reinforcing sheet 30 may have any form that the warpage of the multilayer laminate 26 can be prevented or reduced, such as a sheet, a film, a plate, and a foil, preferably a sheet or a plate. The reinforcing sheet 30 may be formed by stacking, for example, these sheets, films, plates, and foils. Typical examples of the reinforcing sheet 30 include a metal sheet, a resin sheet (in particular, a hard resin sheet), and a glass sheet. The reinforcing sheet 30 has a thickness of preferably 10 µm to 1 mm, more preferably 50 to 800 µm, further more preferably 100 to 600 µm from the viewpoint of the strength retention and handling readiness of the reinforcing sheet 30. In case that the reinforcing sheet 30 is a metal sheet (for example, stainless steel sheet), a ten-point mean roughness Rz-jis (measured in accordance with JIS B 0601-2001) on the surface, where the soluble adhesive layer 28 is formed, of the metal sheet is preferably 0.05 to 500 µm, more preferably 0.5 to 400 µm, further more preferably 1 to 300 µm. Such a surface roughness can enhance the adhesion with the soluble adhesive layer 28 and improve the release strength in the soluble adhesive layer 28 due to an anchor effect caused by the irregularities on the surface.

The reinforcing sheet 30 may have an opening 30a. For example, an electrical inspection can be performed by bringing inspection probes into contact with the wiring layer on the outermost surface through the opening 30a. In addition, the opening 30a can further promote the infiltration of the dissolving liquid into the facing area F. The opening 30a may have any shape and size that are appropriately determined depending on the purpose. In the case that the reinforcing sheet 30 has the opening 30a, an additional reinforcing sheet having no opening (not shown) may be bonded on the reinforcing sheet 30 stacked on the multilayer laminate 26 to avoid a reduction in the reinforcing effect due to the presence of the opening 30a. This configuration can more effectively prevent the warpage of the multilayer laminate 26 during the release of the substrate 12. In this case, the additional reinforcing sheet may be released from the multilayer laminate 26 after the release of the substrate 12 and before the electrical inspection. Furthermore, after the electrical inspection, the opening 30a may be filled with a further reinforcing member (not shown), thereby a reduction in the reinforcing effect due to the opening 30a can be avoided to more effectively prevent the warpage of the multilayer laminate 26, resulting in ready mounting of an electronic device 32. In this case, the reinforcing member may be released from the multilayer laminate 26 after the electronic device 32 is mounted.

(4) Release of Substrate (Optional Step)

Figure 2:
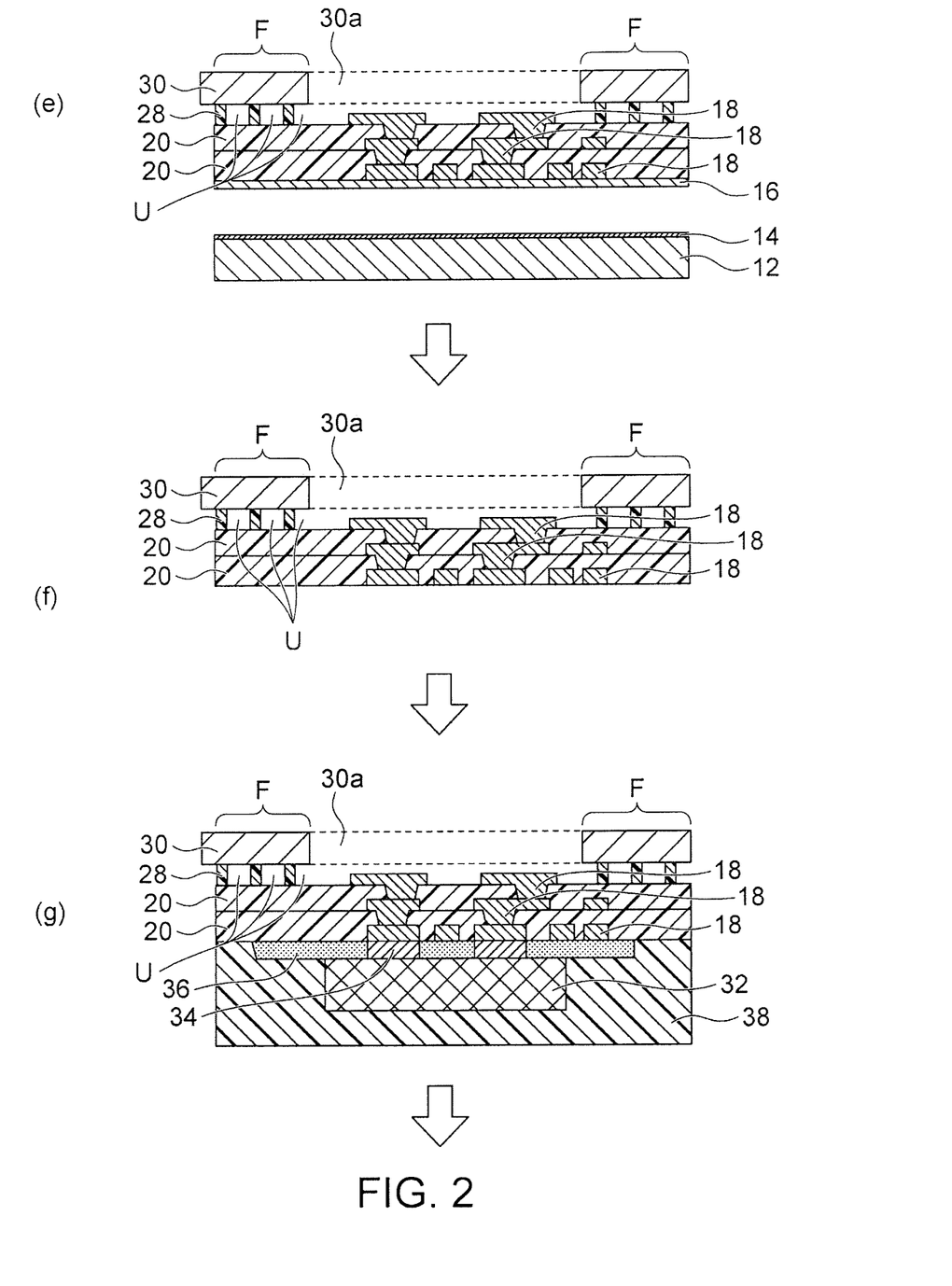
FIG. 2 is a flow chart illustrating the steps from releasing of a substrate to mounting of an electronic device in the method of the present invention.

In the embodiment using the laminated sheet 10, as shown in FIG. 2(e), the substrate 12 is preferably released from the metal layer 16 at the release layer 14 after stacking the reinforcing sheet 30 and before releasing the reinforcing sheet 30. In other words, the substrate 12, an adhesive metal layer (if present), an auxiliary release layer (if present), and the release layer 14 are released and removed, preferably based on a physical separation process. In this physical separation process, the substrate 12, for example, is released from the build-up wiring layer with hand, a jig, or machines. In this case, the reinforcing sheet 30 closely bonds to and reinforces the multilayer laminate 26 with the soluble adhesive layer 28 therebetween; hence, the large local warpage can be prevented on the multilayer laminate 26. In other words, the reinforcing sheet 30 reinforces the multilayer laminate 26 to resist the releasing force during the release of the substrate 12, thereby preventing and reducing the warpage more effectively. In this manner, the disconnection and separation of the wiring layer, which may be caused by the warpage, can be avoided inside the build-up wiring layer, thereby the reliability of connection in the multilayer wiring layer can be improved. In addition, the flatness (coplanarity) on the surfaces of the multilayer wiring layer can be improved through the effective prevention or reduction of warpage.

In particular, a soluble adhesive layer 28 exhibiting a release strength higher than that of the release layer 14 facilitates the release of the substrate 12 through the separation at the release layer 14 not through the separation at the soluble adhesive layer 28. Accordingly, the reinforcing sheet 30 in close contact with the multilayer laminate 26 with the soluble adhesive layer 28 therebetween can retain a close-contact state more stably even when the substrate 12 is released.

(5) Etching Removal of Metal Layer (Optional Step)

As shown in FIG. 2(f), the metal layer 16 is removed by etching before the release of the reinforcing sheet 30 as needed. The metal layer 16 may be etched based on a known process, such as flash etching.

In particular, a process of mounting chips after forming a build-up wiring layer as described above is called an RDL-First process. Since this process enables visual inspection and electrical inspection of the multilayer wiring layer 18 to be performed before the mounting of chips, the chips can be mounted only on non-defective portions while excluding defective portions of the respective wiring layers. As a result, the RDL-First process is economically advantageous from the viewpoint of avoiding the waste of the chip as compared to, for example, a Chip-First process, in which wiring layers are sequentially stacked on the surface of the chip. In the manufacturing process of the printed wiring board (in particular, the RDL-First process), the visual inspection and electrical inspection on the wiring layer can be performed before the mounting of chips to improve the finished product yield. In particular, use of the soluble adhesive layer 28 and the reinforcing sheet 30 in the manufacturing method of the present invention ensures a desirable flatness on two surfaces of the multilayer laminate 26 due to a reduced warpage, resulting in accurate probing during the electrical inspection.

(6) Surface Treatment of First Wiring Layer (Optional Step)

After the above step, a solder resist layer, a surface metal treatment layer (for example, an organic solderability preservative (OSP) treatment layer, an Au plating layer, a Ni—Au plating layer), metal pillars for mounting electronic devices and/or solder bumps may be formed as needed on the surface of the first wiring layer 18.

(7) Mounting of Electronic Device (Optional Step)

As shown in FIG. 2(g), the electronic device 32 is optionally mounted on the surface, remote from the reinforcing sheet 30, of the multilayer laminate 26 after stacking the reinforcing sheet 30 (or after removing the metal layer 16 or subsequent electrical inspection) and before releasing the reinforcing sheet 30. The inventive method using the soluble adhesive layer 28 and the reinforcing sheet 30 can achieve excellent surface flatness (coplanarity) that is advantageous for mounting of the electronic device 32 on the surface of the multilayer laminate 26 (for example, on the surface of the build-up wiring layer including the first wiring layer 18 as an embedded electrode). In other words, when the electronic device 32 is mounted, the reinforcing sheet 30 can prevent large local warpage of the multilayer laminate 26. As a result, the yield of connection can be increased during mounting the electronic device.

Examples of the electronic device 32 include semiconductor devices, chip capacitors, and resistors. Examples of processes for mounting the electronic device include a flip chip mounting process and a die bonding process. In the flip chip mounting process, mounting pads of the electronic device 32 and the first wiring layer 18 are bonded. As shown in FIG. 2(g), columnar electrodes (pillars) or solder bumps 34, for example, may be formed on the mounting pads, and a sealing resin film 36, for example a non-conductive film (NCF), may be attached on the surface including the first wiring layer 18 before mounting. The bonding is carried out preferably with a metal having a low melting point, such as a solder, or an anisotropic conductive film. In the die bonding process, the first wiring layer 18 is bonded to the surface, opposite to the mounting pad surface, of the electronic device 32. A paste or a film composed of a resin composition containing a thermosetting resin and a thermally conductive inorganic filler is preferably used for this bonding. In any process, as shown in FIG. 2(g), the electronic device 32 is preferably sealed with sealing material 38 in order to further improve the rigidity of the entire laminate including the multilayer laminate 26 and the electronic device 32.

(8) Dissolution or Softening of Soluble Adhesive Layer

A liquid capable of dissolving the soluble adhesive layer 28 is allowed to infiltrate the unoccupied region U to dissolve or soften the soluble adhesive layer 28. Softening may be typically achieved by swelling of the soluble adhesive layer 28. As described above, the dissolving liquid contains a liquid capable of dissolving the soluble adhesive layer 28; hence, the soluble adhesive layer 28 is at least partially dissolved through contact with the dissolving liquid, resulting in infiltration of the dissolving liquid into the soluble adhesive layer 28. Such contact or infiltration of the dissolving liquid causes the dissolution or softening of the soluble adhesive layer 28 and weakens or deadens the adhesion between the multilayer laminate 26 and the reinforcing sheet 30. In this manner, the reinforcing sheet 30 can be significantly readily released in the next step using a dissolution release procedure or similar procedure. In other words, the reinforcing sheet 30 having finished its role can be released within a significantly short time while minimizing the stress applied to the multilayer laminate 26.

The dissolving liquid includes any liquid that can dissolve the soluble adhesive layer 28, and various compositions or liquid chemicals can be used for the dissolving liquid. For example, in the case where the soluble adhesive layer 28 contains an acid-soluble resin, the dissolving liquid may be acid solution. Examples of such acid solutions include hydrochloric acid, nitric acid, sulfuric acid, and hydrofluoric acid. In the case where the soluble adhesive layer 28 contains an alkali-soluble resin, the dissolving liquid may be alkaline solution. Examples of such alkaline solutions include ethyl carboxylate (e.g., ethyl acetate), aqueous $NaHCO_3$ solution, aqueous $Na_2CO_3$ solution, and aqueous NaOH solution.

(9) Release of Reinforcing Sheet

Figure 3:
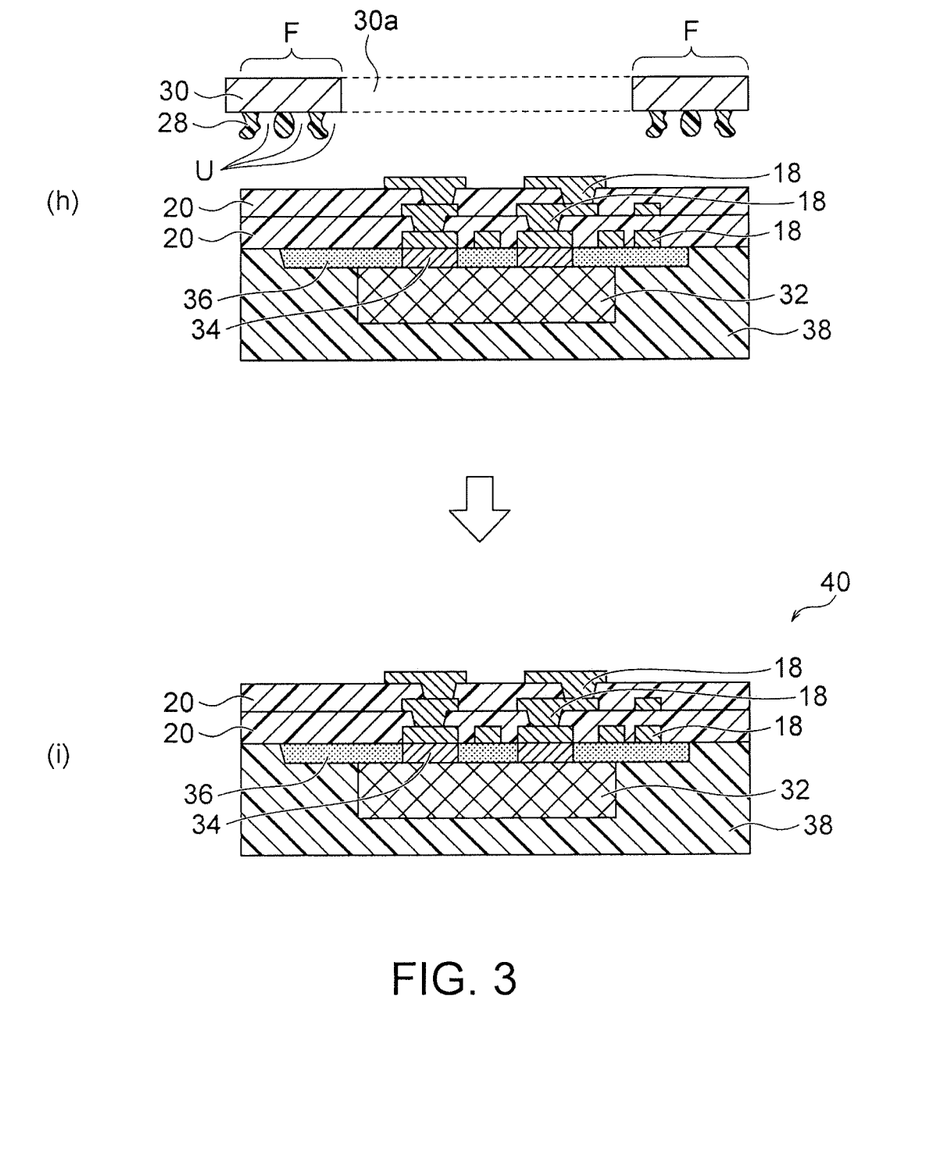
FIG. 3 is a flow chart illustrating the steps from releasing of a reinforcing sheet to completion of a multilayer wiring board in the method of the present invention.

As shown in FIGS. 3(h) and 3(i), the reinforcing sheet 30 is released from the multilayer laminate 26 at the position of the soluble adhesive layer 28 to give a multilayer wiring board 40. The reinforcing sheet 30 is in a very readily releasable state due to the dissolution or softening of the soluble adhesive layer 28 (or in some cases, partially released naturally), resulting in the ready release of the reinforcing sheet 30 by lightly peeling off with hand, a jig, or a machine. Accordingly, the reinforcing sheet 30 can be released within a remarkably short time under a minimum stress applied to the multilayer laminate 26. The minimum stress applied to the multilayer laminate 26 in this manner can effectively avoid the disconnection of the wiring and the disconnection of the mounting portion in the multilayer wiring board 40. Even if the soluble adhesive layer 28 is used for a reduction in the stress, mere release with the dissolving liquid requires a great deal of time. In contrast, according to the method of the present invention, the use of the opening 30a facilitates the contact or infiltration of the dissolving liquid, resulting in drastically shortening the time required for the release of the reinforcing sheet 30.

If the soluble adhesive layer 28 inherently has a higher release strength than the release layer 14 in the embodiment using the laminated sheet 10, the soluble adhesive layer 28 has higher resistance to releasing than the release layer 14 unless specific treatment is performed. In the method of the present invention, however, the contact or infiltration of the dissolving liquid causes the dissolution or softening of the soluble adhesive layer 28, and weakens or deadens the adhesion between the multilayer laminate 26 and the reinforcing sheet 30, resulting in ready release of the reinforcing sheet 30.

(10) Others

At least one side of the substrate 12 and/or the reinforcing sheet 30 preferably extends from the end portion of the build-up wiring layer. A user can grasp such an extension and readily release the substrate 12 or the reinforcing sheet 30.

Laminated Sheet

As described above, the laminated sheet 10 used in the method of the present invention as needed comprises, in sequence, the substrate 12, the release layer 14, and the metal layer 16. The laminated sheet 10 may be in the form of a so-called copper foil with a carrier.

The substrate 12 may be made of any material, such as glass, ceramic, resin, or metal. The substrate 12 may have any form, such as a sheet, a film, a plate, or a foil. Further, the substrate 12 may be a laminate of these sheets, films, plates and/or foils. For example, the substrate 12 may be a rigid support, such as a glass plate, a ceramic plate or a metal plate, or may be a non-rigid support, such as a metal foil or a resin film. Preferred examples of the substrate 12 include metal sheets, glass sheets, ceramic plates, laminates of metal sheets and prepregs, metal sheets coated with adhesives, and resin sheets (in particular hard resin sheets). Preferred examples of the metal of the substrate 12 include copper, titanium, nickel, stainless steel, and aluminum. Preferred examples of the ceramics include alumina, zirconia, silicon nitride, and aluminum nitride (fine ceramics). Preferred examples of the resin include epoxy resins, aramid resins, polyimide resins, polyamide or nylon resins, liquid crystal polymers, PEEK resins, polyamideimide resins, polyethersulfone resins, polyphenylene sulfide resins, PTFE resins, and ETFE resins. More preferably the thermal expansion coefficient (CTE) is less than 25 ppm/K (preferably 1.0 to 23 ppm/K, more preferably 1.0 to 15 ppm/K, further more preferably 1.0 to 10 ppm/K), from the viewpoint of preventing warpage of a coreless support due to heat when an electronic device is mounted. Examples of such materials include various resins as described above (especially resins with low thermal expansion, such as polyimide resins or liquid crystal polymers), prepregs made of various resins and glass fibers as described above, glass, and ceramics. In view of handling properties and securing the flatness when a chip is mounted, the substrate 12 has a Vickers hardness of preferably 500 to 3000 HV, more preferably 550 to 2500 HV, further more preferably 600 to 2000 HV.

For materials that satisfies these properties, the substrate 12 is preferably composed of a resin film, glass or ceramic, more preferably glass or ceramic, particularly more preferably glass. For example, the substrate 12 is a glass sheet. The substrate 12 composed of glass has light weight, low thermal expansion coefficient, high insulating properties, high rigidity and high surface flatness, and thus the metal layer 16 has a significantly smooth surface. In addition, the substrate 12 composed of glass has some advantages, for example, surface flatness (coplanarity) favorable to mounting of the electronic device, and chemical resistance during the desmear step and various plating steps in a manufacturing process of the printed wiring board. Preferred examples of the glass constituting the substrate 12 include quartz glass, borosilicate glass, alkali-free glass, soda-lime glass, aluminosilicate glass, and combinations thereof, more preferably alkali-free glass. The alkali-free glass, which contains substantially no alkali metal, contains silicon dioxide, aluminum oxide, boron oxide, an alkaline earth metal oxide, such as calcium oxide or barium oxide as main components, and further contains boric acid. Since the alkali-free glass has a low thermal expansion coefficient in the range of 3 to 5 ppm/K over a wide temperature range from 0° C. to 350° C., the warpage of the glass can be advantageously minimized when a semiconductor chip is mounted as an electronic device.

The substrate 12 has a thickness of preferably from 100 to 2000 µm, more preferably from 300 to 1800 µm, further more preferably from 400 to 1100 µm. At a thickness within such ranges, the printed wiring board can be thinned while retaining adequate strength that does not interfere handling and electronic parts can be mounted with reduced warpage.

The surface, adjacent to the release layer 14 (adjacent to an adhesive metal layer if present), of the substrate 12 has an arithmetic mean roughness Ra of preferably 0.1 to 70 nm, more preferably 0.5 to 60 nm, further more preferably 1.0 to 50 nm, particularly more preferably 1.5 to 40 nm, most preferably 2.0 to 30 nm as measured in accordance with JIS B 0601-2001. A smaller arithmetic mean roughness on the surface, adjacent to the release layer 14, of the substrate 12 desirably causes a smaller arithmetic mean roughness Ra on the surface, remote from the release layer 14 (the outer surface of the metal layer 16), of the metal layer 16. As a result, the roughness Ra is suitable for forming a wiring pattern highly refined to a line/space (l/S) ratio of 13 µm or less/13 µm or less (for example, from 12 µm/12 µm to 1 µm/1 µm) in a printed wiring board manufactured with the laminated sheet 10.

The laminated sheet 10 may have an optional adhesive metal layer and/or an optional auxiliary release layer, preferably in this order, on the surface, adjacent to the release layer 14, of the substrate 12.

The optional adhesive metal layer is preferably composed of at least one metal selected from the group consisting of Ti, Cr and Ni, and may be a pure metal or an alloy from the viewpoint of assuring the adhesion to the substrate 12. The metal composed of the adhesive metal layer may contain incidental impurities derived from, for example, raw material components and a formation process of film. Also, the metal may contain oxygen derived from the air when the adhesive metal layer is exposed to the atmosphere after the formation of film. The adhesive metal layer is preferably formed by a gas-phase process such as sputtering. In particular, the adhesive metal layer is preferably formed by a magnetron sputtering process with a metal target because the process can improve the uniformity of distribution in film thickness. The adhesive metal layer has a thickness of preferably 5 to 500 nm, more preferably 10 to 300 nm, further more preferably 18 to 200 nm, particularly more preferably 20 to 150 nm. The thickness is measured by analyzing the cross-sectional area of the layer with an energy dispersive X-ray spectrometer in a transmission electron microscope (TEM-EDX).

An optional auxiliary release layer is preferably composed of copper in view of controlling release strength of the release layer 14 into a desired value. The copper that constitutes the auxiliary release layer may contain incidental impurities derived from, for example, raw material components or a formation process of film. Also, the metal may contain oxygen derived from the air when the auxiliary release layer is exposed to the atmosphere before and after the formation of film. However, the adhesive metal layer and the auxiliary release layer may be preferably continuously formed without exposing to the atmosphere. The auxiliary release layer is preferably formed by a gas-phase process such as sputtering. In particular, the auxiliary release layer is preferably formed by a magnetron sputtering process with a copper target because the process can improve the uniformity of distribution in film thickness. The auxiliary release layer has a thickness of preferably 5 to 500 nm, more preferably 10 to 400 nm, further more preferably 15 to 300 nm, particularly more preferably 20 to 200 nm. The thickness is measured by analyzing the cross-sectional area of the layer with an energy dispersive X-ray spectrometer in a transmission electron microscope (TEM-EDX).

The release layer 14 may be composed of any material that enables the release of the substrate 12. For example, the release layer 14 can be composed of a known material employed as a release layer of a copper foil with a carrier. The release layer 14 may be either an organic release layer or an inorganic release layer. Examples of organic components used in the organic release layer include nitrogen-containing organic compounds, sulfur-containing organic compounds, and carboxylic acids. Examples of the nitrogen-containing organic compounds include triazole compounds and imidazole compounds. Examples of the inorganic components used in the inorganic release layer include at least one metal oxide selected from the group consisting of Ni, Mo, Co, Cr, Fe, Ti, W, P and Zn, mixture of metals and nonmetals, and carbon. It is preferred that the release layer 14 is a layer mainly containing carbon, more preferably a layer mainly composed of carbon or hydrocarbon, and further more preferably a film of amorphous carbon as hard carbon, or a carbon-nitrogen mixture from the viewpoint of ready separation and formation of film. In this case, the release layer 14 (i.e. the carbon layer) has preferably a carbon content of 60 atomic % or more, more preferably 70 atomic % or more, further more preferably 80 atomic % or more, particularly more preferably 85 atomic % or more, measured by XPS. The carbon content has no upper limit and may be 100 atomic % or practically 98 atomic % or less. The release layer 14 (particularly, the carbon layer) may contain incidental impurities (for example, oxygen, carbon and hydrogen derived from an atmospheric environment). In addition, metal atoms may be mixed into the release layer 14 (in particular, the carbon layer) depending on a process of forming the metal layer 16. Since carbon has low diffusion to and low reactivity with the substrate 12, the formation of the metallic bond between the metal layer 16 (e.g., copper foil layer) and the bonding interface can be prevented at an elevated temperature, and the substrate 12 can be maintained under a condition where release and removal are ready even when a press working is carried out at a temperature exceeding 300° C. The release layer 14 is preferably formed by a gas-phase process such as sputtering, in order to avoid excess impurities in the amorphous carbon and to achieve continuous formation of the adhesive metal layer and/or auxiliary release layer. The release layer 14 has a thickness of preferably 1 to 20 nm, more preferably 1 to 10 nm. The thickness is measured by analyzing the cross-sectional area of the layer with an energy dispersive X-ray spectrometer in a transmission electron microscope (TEM-EDX).

The release layer 14 preferably has a release strength of 1 to 30 gf/cm, more preferably 3 to 20 gf/cm, further more preferably 4 to 15 gf/cm in order to minimize the stress concentration to the first wiring layer 18 to the utmost and thereby facilitate the release process when the release layer 14 is separated. The release strength of the release layer 14 is measured as follows: A release layer 14 is formed on a substrate 12, a copper layer as a metal layer 16 is formed on the release layer to give a laminated sheet, an electroplated copper film having a thickness of 18 μm is formed on the laminated sheet, and a copper-clad laminate is thereby formed; and then, the release strength (gf/cm) is measured in accordance with JIS C 6481-1996 when the electroplated copper film integrated with the metal layer 16 is separated.

The release strength of the release layer 14 can be adjusted by, for example, controlling the thickness of the release layer 14, or selecting the composition of the release layer 14.

The metal layer 16 is composed of metal, and preferably includes a power supply sublayer to supply power to the first wiring layer 18 described below. The metal layer 16 or the power supply sublayer may be a copper foil produced by any process, for example, a wet process, such as an electroless copper plating or an electrolytic copper plating; a physical vapor deposition process, such as sputtering or vacuum vapor deposition; chemical vapor deposition; or a combination thereof. The preferred metal that constitutes the power supply sublayer is copper and thus the preferred power supply sublayer can be an extremely thin copper layer. The power supply sublayer is composed of particularly preferably a copper layer deposited by a gas-phase process, such as sputtering or vacuum vapor deposition, and most preferably a copper layer deposited by the sputtering in order to appropriately build a fine pitch circuit through an extremely thinning process. Although the extremely thin copper layer is preferably a non-roughened copper layer, it may be subjected to preliminary roughening or secondary roughening, such as soft etching, cleaning, or oxidation-reduction, as long as the roughening process does not interfere with the formation of a wiring pattern when a printed wiring board is manufactured. The power supply sublayer (for example, an extremely thin copper layer) constituting the metal layer 16 may have any thickness of, preferably 50 to 3000 nm, more preferably 70 to 2500 nm, further more preferably 80 to 2000 nm, particularly preferably 90 to 1500 nm, particularly more preferably 120 to 1000 nm, most preferably 150 to 500 nm in order to form a fine pitch circuit as described above. The power supply sublayer having a thickness within the above range (for example, an extremely thin copper layer) is preferably manufactured by a sputtering process from the viewpoint of the in-plane uniformity of the layer thickness and the productivity to yield a layer in the form of a sheet or a roll.

The surface, remote from the release layer 14 (the outer surface of the metal layer 16), of the metal layer 16 has an arithmetic mean roughness Ra of preferably 1.0 to 100 nm, more preferably 2.0 to 40 nm, further more preferably 3.0 to 35 nm, particularly more preferably 4.0 to 30 nm, most preferably from 5.0 to 15 nm as measured in accordance with JIS B 0601-2001. A smaller arithmetic mean roughness is suitable for forming a wiring pattern more highly refined to a line/space (L/S) ratio of 13 μm or less/13 μm or less (for example, from 12 μm/12 μm to 1 μm/1 μm) in a printed wiring board manufactured with the laminated sheet 10. In the case of such a smooth surface, a contactless surface roughness measurement is preferably employed in the measurement of the arithmetic mean roughness Ra.

The metal layer 16 may have a multilayer structure composed of two or more sublayers. For example, the metal layer 16 may have an antireflection sublayer on the surface, adjacent to the release layer 14, of the power supply sublayer in addition to the power supply sublayer. In other words, the metal layer 16 may include the power supply sublayer and the antireflection sublayer. The antireflection sublayer is preferably composed of at least one metal selected from the group consisting of Cr, W, Ta, Ti, Ni and Mo. At least the surface, adjacent to the power supply sublayer, of the antireflection sublayer is preferably composed of aggregates of metal particles. The antireflection sublayer may have a structure which is entirely composed of the aggregates of metal particles, or a multilayer structure including a sub-sublayer composed of the aggregates of metal particles and a subsublayer that is not composed of particles below the subsublayer composed of the particles. The aggregates of metal particles constituting the surface, adjacent to the power supply sublayer, of the antireflection sublayer exhibits a desirable dark color caused by a metal material and a particulate form, and the dark color results in a desirable visual contrast to the wiring layer composed of copper and thereby improves the visibility in image inspection (for example, automatic optical inspection (AOI)). Accordingly, the surface of the antireflection sublayer irregularly reflects light due to a convex shape of the metal particles to be recognized as the black color. In addition, the antireflection sublayer has appropriate adhesion and separability to the release layer 14, excellent adhesion to the power supply sublayer, and excellent separation resistance to the developer when a photoresist layer is formed. The surface, adjacent to the power supply sublayer, of the antireflection sublayer preferably has a glossiness Gs (at 60°) of 500 or less, more preferably 450 or less, further more preferably 400 or less, particularly more preferably 350 or less, most preferably 300 or less in view of improvements in contrast and visibility. Since a lower limit of the glossiness Gs (at 60°) is preferably as low as possible, the glossiness Gs (at 60°) on the surface, adjacent to the power supply sublayer, of the antireflection sublayer may be any low value of, practically 100 or more, and more practically 150 or more. Specular glossiness Gs (at 60°) by image analysis of roughened particles can be measured with a commercially available glossiness meter in accordance with JIS Z 8741-1997 (method of measuring specular glossiness).

In order to improve the contrast and the visibility and to enhance the uniformity of flash etching, the surface, adjacent to the power supply sublayer, of the antireflection sublayer is composed of aggregates of metal particles. In such particles, the equivalent circle diameter of a projected area determined by SEM image analysis is preferably 10 to 100 nm, more preferably 25 to 100 nm, further more preferably 65 to 95 nm. The equivalent circle diameter of the projected area can be measured by photographing the surface of the antireflection sublayer at a predetermined magnification (for example, 50,000 folds) with a scanning electron microscope and analyzing the resultant SEM images. In particular, the arithmetic mean value of the equivalent circle diameters of the projected area is employed in this measurement where the equivalent circle diameters are measured with commercially available software for image analytical particle size distribution (for example, Mac-VIEW manufactured by Mountech Co., Ltd.).

The antireflection sublayer is composed of at least one metal selected from Cr, W, Ta, Ti, Ni and Mo, preferably at least one metal selected from Ta, Ti, Ni and Mo, more preferably at least one metal selected from Ti, Ni and Mo, most preferably Ti. These metals may be pure metals or alloys. In any case, these metals are preferably not inherently oxidized (essentially not metal oxides) to exhibit a desired dark color which can improve a visual contrast to Cu. In particular, the antireflection sublayer has an oxygen content of preferably 0 to 15 atomic %, more preferably 0 to 13 atomic %, further more preferably 1 to 10 atomic %. In any case, the metals do not dissolve in a copper flash etching solution, and thereby can exhibit excellent chemical resistance to the copper flash etching solution. The antireflection sublayer has a thickness of preferably 1 to 500 nm, more preferably 10 to 300 nm, further more preferably 20 to 200 nm, most preferably 30 to 150 nm.

The invention claimed is:

1. A method of manufacturing a multilayer wiring board, comprising:
    providing a laminated sheet comprising, in sequence, a substrate, a release layer, and a metal layer;
    forming a first wiring layer directly on a surface of the metal layer;
    alternately stacking insulating layers and wiring layers on the laminated sheet on which the first wiring layer is formed to produce a multilayer laminate;
    stacking a reinforcing sheet on one surface of the multilayer laminate with a soluble adhesive layer therebetween, wherein an unoccupied region without the soluble adhesive layer is provided within a facing area where the reinforcing sheet faces the multilayer laminate, and wherein the soluble adhesive layer is in direct contact with both the multilayer laminate and the reinforcing sheet during the stacking of the reinforcing sheet;
    allowing a liquid capable of dissolving the soluble adhesive layer to infiltrate the unoccupied region to dissolve or soften the soluble adhesive layer; and
    releasing the reinforcing sheet from the multilayer laminate at the soluble adhesive layer to give a multilayer wiring board;
    wherein the reinforcing sheet has a spring deflection limit $Kb_{0.1}$ of 100 to 1500 N/mm$^2$ as measured in accordance with the repeated deflection test of JIS H 3130-2012.

2. The method according to claim 1, wherein a ratio of an area of the unoccupied region to an area of the facing area is 20 to 90 area %.

3. The method according to claim 1, wherein each occupied region covered with the soluble adhesive layer has a circumscribed circle diameter of 0.1 to 10 mm, and the each occupied region is surrounded by the unoccupied region.

4. The method according to claim 1, wherein the soluble adhesive layer has a thickness of 0.5 to 50 μm.

5. The method according to claim 1, wherein the soluble adhesive layer comprises a solution-soluble resin.

6. The method according to claim 1, wherein the soluble adhesive layer comprises an acid-soluble resin or an alkali-soluble resin.

7. The method according to claim 1, further comprising mounting an electronic device on a surface of the multilayer laminate after stacking the reinforcing sheet and before releasing the reinforcing sheet, the surface being remote from the reinforcing sheet.

8. The method according to claim 1, wherein the reinforcing sheet has an opening.

9. The method according to claim 1, wherein stacking the reinforcing sheet with the soluble adhesive layer comprises:
    providing a composite film comprising the soluble adhesive layer on a first protective film;
    stacking the composite film on the reinforcing sheet and/or the multilayer laminate such that the soluble adhesive layer comes into contact with the reinforcing sheet and/or the multilayer laminate; and
    releasing the first protective film from the soluble adhesive layer.

10. The method according to claim 9, wherein providing the composite film further comprises providing a second protective film on a surface of the composite film, the surface being adjacent to the soluble adhesive layer,
    wherein the method further comprises releasing the second protective film before stacking the composite film on the reinforcing sheet and/or the multilayer laminate.

11. The method according to claim 1, further comprising releasing the substrate from the metal layer at the release layer after stacking the reinforcing sheet and before releasing the reinforcing sheet.

12. The method according to claim 1, further comprising removing the metal layer by etching before releasing the reinforcing sheet.

* * * * *